United States Patent [19]

Schlecht et al.

[11] 4,326,191
[45] Apr. 20, 1982

[54] AUTOMATIC SWITCHING MATRIX

[75] Inventors: Martin F. Schlecht, Cambridge; John G. Kassakian, Newton; Anthony J. Caloggero, Lynn; Bruce Rhodes, Dorchester; David Otten, Newton; Neil Rasmussen, Sudbury, all of Mass.

[73] Assignee: Massachusetts Institute of Technology, Cambridge, Mass.

[21] Appl. No.: 117,706

[22] Filed: Feb. 1, 1980

[51] Int. Cl.³ .............................................. H04Q 1/02
[52] U.S. Cl. .......................... 340/825.79; 340/825.22; 361/352
[58] Field of Search ............................ 340/166, 147 P; 361/416, 352; 199/4, 7, 29, 34, 77, 96; 200/18, 46, 175; 234/89; 364/468

[56] References Cited

U.S. PATENT DOCUMENTS

| | | | |
|---|---|---|---|
| 3,219,927 | 11/1965 | Topp, Jr. et al. | 340/166 R |
| 3,631,374 | 12/1971 | Cartelli | 361/352 |
| 3,796,848 | 3/1974 | Southworth, Jr. | 361/352 |
| 3,905,020 | 9/1975 | Knox | 340/147 P |

Primary Examiner—Donald J. Yusko
Attorney, Agent, or Firm—Arthur A. Smith, Jr.; Thomas J. Engellenner

[57] ABSTRACT

An automatic switching matrix that includes an apertured matrix board containing a matrix of wires that can be interconnected at each aperture. Each aperture has associated therewith a conductive pin which, when fully inserted into the associated aperture, effects electrical connection between the wires within that particular aperture. Means is provided for automatically inserting the pins in a determined pattern and for removing all the pins to permit other interconnecting patterns.

2 Claims, 8 Drawing Figures

AUTOMATIC SWITCHING MATRIX

The Government has rights in this invention pursuant to Contract No. Ex-76-A-01-2295 T.O. 47 awarded by the U.S. Department of Energy.

The present invention relates to switching matrices for use in electrical circuits.

There is a need, for example, in laboratory and other work employing bread-board circuits, for a mechanism that can quickly and reliably automatically effect interconnection of a large number of circuit elements to form an electrical circuit and, with minimal delay, reconnect to form another circuit, and so forth. One use for such mechanism is shown in an application for Letters Patent, now U.S. Pat. No. 4,215,420 (Kassakian) issued July 29, 1980 (assigned to the present assignee, the Massachusetts Institute of Technology), but other uses exist as well; e.g., the scheme can also be used in conventional analog computers.

The usual way that a particular circuit interconnection has been made is by a manual interconnection to achieve a particular circuit topology, any changes in that topology, whether minor or major in nature being accomplished manually. Relatively recent advances in microcomputers presents the possibility of performing manipulative steps in apparatus that is within industry cost constraints, but a microcomputer can only indicate what manipulative steps should be taken. Those steps must be taken by other equipment. It is, accordingly, an object of the present invention to provide a switching matrix which can be used in conjunction with a general purpose or special purpose computer.

Another object is to provide a switching matrix which can automatically provide a circuit configuration and can automatically disconnect all or any part of that circuit configuration and provide a new configuration.

These and still further objects are addressed hereinafter.

The foregoing objects are achieved, generally, in an automatic switching matrix that includes the combination of an apertured matrix board comprising a matrix of conductors that can be electrically interconnected at any intersection thereof, which intersection corresponds with an aperture (or hole) in the matrix board from one major surface to the other major surface thereof. A plurality of connection pins is provided. The connection pins are moved into the apertures (or holes) to effect interconnection of the conductors in the aperture (or hole) associated with a particular pin and removed from the aperture (or hole) to disconnect the interconnection. The system is rendered automatic by a mechanism which effects depression of individual conductive pins under computer control and automatic reset by effecting removal of the conductive pins from the associated aperture (or hole).

The invention is hereinafter described with reference to the accompanying drawing in which.

Figure 1:
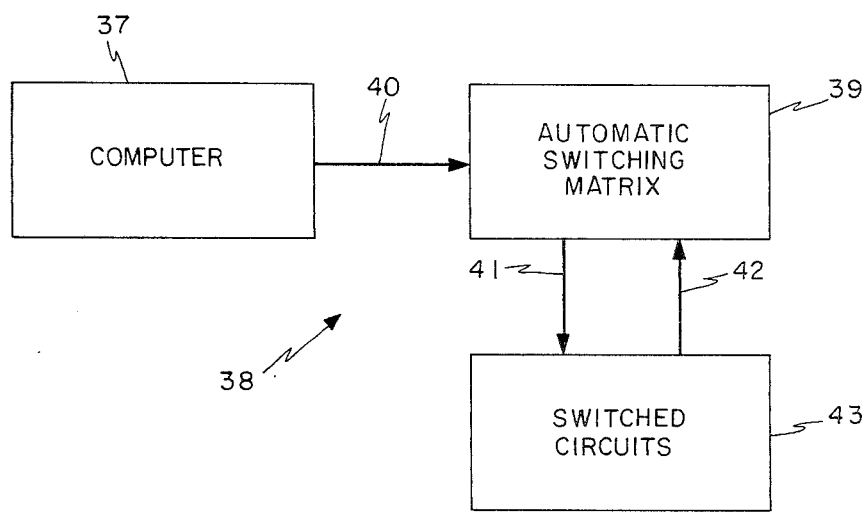
FIG. 1 is a diagrammatic representation of a system that includes an automatic switching matrix of the present invention and a computer.

Turning now to FIG. 1, the system labeled 38 includes an automatic switching matrix 39 which, under the control of a computer 37, serves to effect automatic interconnection of circuits in the block 43 which may be of the type in said U.S. Pat. No. 4,215,420, but need not be.

Figure 5:
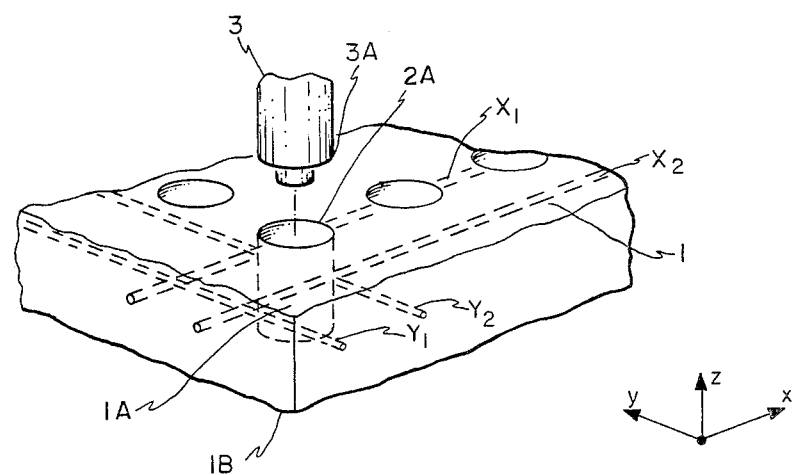
FIG. 5 is a greatly enlarged partial (cross-hatching is omitted) isometric view showing details of one of the apertures in the apertured matrix board of FIG. 4A.
Figure 2:
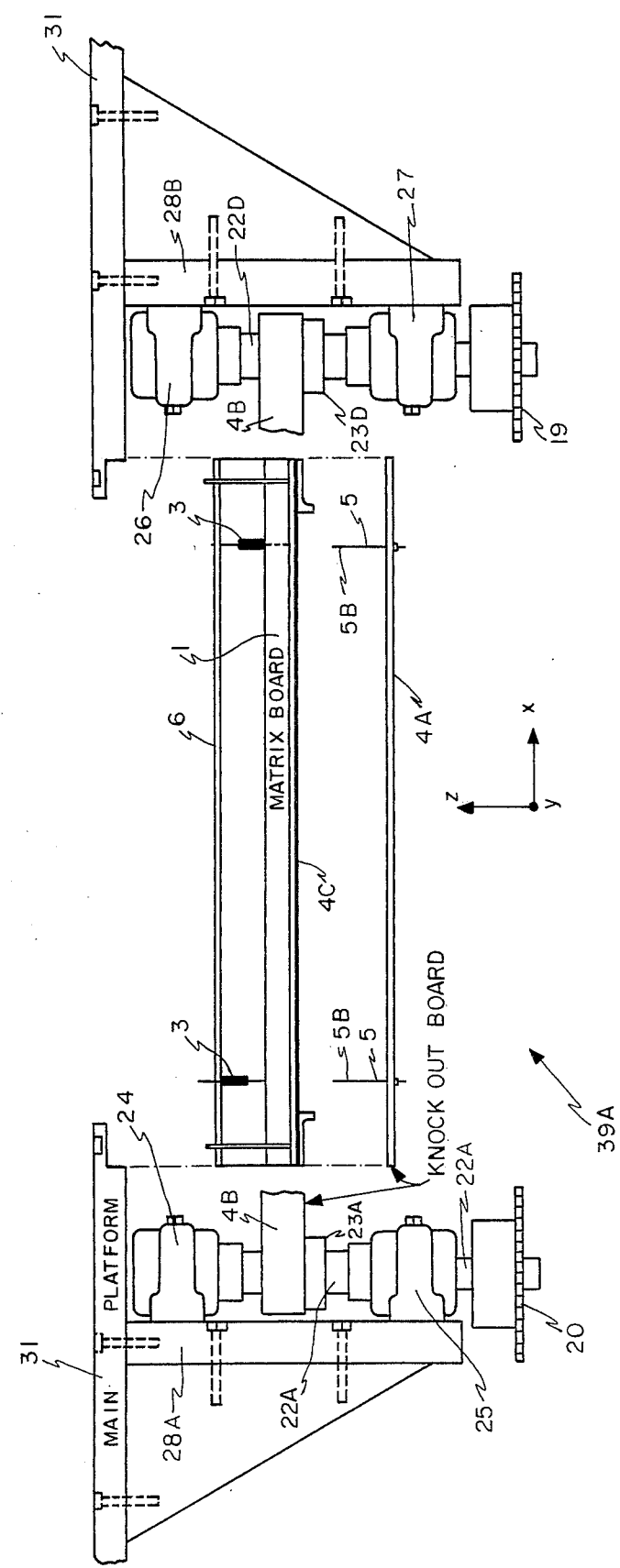
FIG. 2 is a front elevation view of a portion of the automatic switching matrix shown in block-diagram form in FIG. 1.
Figures 4A, 4B, 4C:
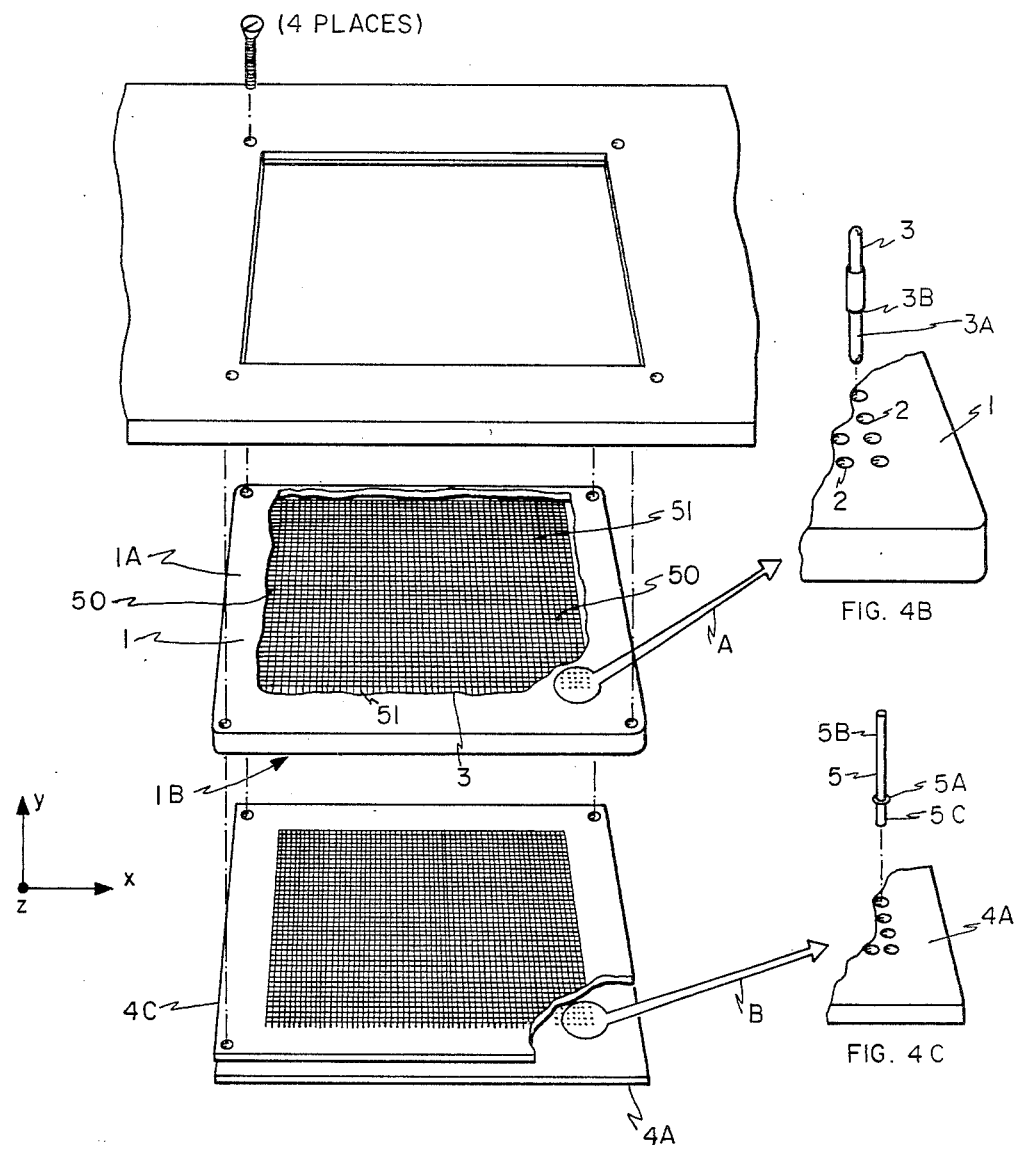
FIG. 4A is an isometric, exploded view, partly cutaway, showing some of the structural elements of the automatic switching matrix of FIG. 2.
FIGS. 4B and 4C show details, greatly enlarged, respectively of the circled portions indicated by the arrows labeled A and B in FIG. 4A, FIG. 4B showing, among other things, a plurality of apertures in an apertured matrix board.

The automatic switching matrix marked 39A in FIG. 2 includes an apertured matrix board 1 which is now discussed in some detail to lay a foundation for the further discussion that follows. The matrix board in the system built and used at the Massachusetts Institute of Technology (M.I.T.) for the purposes herein disclosed, is a fiberglass sandwich structure which contains a matrix of intersecting conductors (e.g., the conductors $X_1$-$X_2$ and $Y_1$-$Y_2$ in FIG. 5 discussed below) that can be interconnected at the intersection thereof. (The actual matrix board being used was built by LVC Industries Inc., 135-25 37th Avenue, Flushing, N.Y., 11354.) The conductors are a plurality of x-directed conductors 50 and a plurality of y-directed conductors 51 in the matrix board 1 in FIG. 4A. Each x-directed conductor, of course, intersects (but does not effect contact with because of different z coordinates) a y-directed conductor and vice versa, as shown in FIG. 5. Each intersection of an x-directed conductor and a y-directed conductor is at an aperture (or hole) 2 in the matrix board 1. Each aperture (or hole) 2 extends through the thickness of the board 1 from the major surface labeled 1A in FIG. 4A to the major surface labeled 1B. A conductive connection pin 3 in FIG. 4B is associated with each aperture 2 and is held in position to register with an associated aperture by a connection-pin holding board 6 in FIG. 2 (as later discussed) initially out of contact with the conductors located at the associated aperture. Electrical connection between an x-directed conductor and a y-directed conductor in any particular aperture 2 is accomplished by depressing the pin 3 associated with that aperture into the aperture until its shoulder 3B strikes the surface 1A.

With reference to FIG. 5, the matrix of conductors is shown to consist of conductor pairs, the conductor pair $X_1$ and $X_2$ that together form a single x-directed matrix conductor $X_1$-$X_2$ (in other words, each wire 50 in FIG. 4A in actual apparatus is formed of two cooperating conductive strips) and the conductor pair $Y_1$ and $Y_2$ that together form a single y-directed matrix conductor $Y_1$-$Y_2$ (in other words, each wire 51 in FIG. 4A is formed of two cooperating conductive strips) in the aperture marked 2A in FIG. 5. The matrix conductors $X_1$-$X_2$ and $Y_1$-$Y_2$ are separated from one another a distance that is less than the diameter of the lower portion labeled 3A of the pin 3 so that when a pin 3 is inserted into the aperture 2A up to the shoulder 3B thereof, electrical interconnection is effected between the x-directed conductor $X_1$-$X_2$ and the y-directed conductor $Y_1$-$Y_2$. The actual apertured matrix board 1 being used at M.I.T. has 2500 apertures and hence can make 2500 connections, but many less than that typically are made. The conductors $X_1$-$X_2$ and $Y_1$-$Y_2$ in FIG. 5 are, in fact, gold-plated copper strips imbedded in the fiberglass board, but wires or the like or other conductors could be used.

The mechanism for depressing the pins 3 to provide desired interconnection of the various X- and y-directed conductors is discussed later, but to complete the explanation here, once a series of tests has been finished by use of an appropriately electrically interconnected matrix board 1, the pins 3 are reset, i.e., they are removed from contact with the x-y matrix conductors. That reset function is achieved by a knockout board 4A-4B. The knockout board 4A-4B is a composite that includes the knockout-pin fastener 4A in FIGS. 2 and 4A securely attached to the upper surface of the board 4B in FIG. 3 so that the two move up and down together and form a composite unit 4A-4B (the portion 4A holds the pins 5). The knockout board unit 4A-4B contains as many knockout or reset pins 5 in FIG. 4C as there are apertures 2 in the matrix board 1 and each knockout or reset pin 5 is positioned by a knockout-pin aligning board 4C in FIGS. 2 and 4A to register with an aperture 2. The knock-out board unit 4A-4B is caused to move upward (i.e., in the z-direction) in FIG. 2; the portion 5B (only two pins are shown in FIG. 2) enters the aperture 2 (in the matrix board 1) with which it is registered and forces any pin 3 in that particular aperture upward and out of the aperture. In this way, all depressed pins 3 are simultaneously moved out of contact with the x-y matrix wires and the matrix 39A is reset. The knockout board is then lowered to its initial position to remove the knockout pins 5 from the matrix board 1. The manner in which the various functions above discussed are accomplished and the structures therefor are now taken up.

The conductive pins 3 are individually depressed by the plunger marked 7 of a solenoid 8 that is mounted on a solenoid holding block 8A in FIG. 3, so that the solenoid 8 moves in the ±y-direction when the block 8A is moved in the manner described below. The solenoid 8 is part of an X-Y positioning mechanism 10 that further includes an x-directed rail 9 and a y-directed arm 11. Control instructions from the computer 37 in FIG. 1 are fed along multiple conductors 40 in FIGS. 1 and 3 to two electric gear-motors 12A and 12B that respectively effect x-direction movement of the arm 11 along the rail 9 and y-direction of the block 8A along the arm 11. The output shaft of the gear-motor 12A drives a sprocket 35 which drives a chain 36 connected to a gear-box unit 13 in FIG. 3 to move the unit 13 in the x-direction. The gear-motor 12B is coupled to a rotation shaft 30 which drives gears in the gear-box unit 13 which interacts with a sprocket 32 to drive a chain 33 connected to the block 8A to accomplish y-direction movement of the block 8A and, hence, the solenoid 8.

The conductive pins 3 are individually depressed by the plunger 7 of the solenoid 8. Control instructions from the computer 37 in FIG. 1 are fed along the multiple conductors 40 in FIGS. 1 and 3 to the two electric motor 12A in FIG. 3 to cause the mechanism in FIG. 3 to move the arm 11 and the solenoid assembly 8 and 8A in the x-direction with the mechanism 13 as above noted. Then the computer moves the block 8A in the y-direction by sliding 8A along rail 11 to bring the plunger 7 to close proximity with a pin 3; then the solenoid 8 is energized under the control of the computer 37 to cause the plunger 7 to extend from the solenoid and depress the desired pin 3. This performance is repeated many times until all the required pins 3 have been depressed for a particular circuit configuration. Connections to and from the suitable circuits 43 in FIG. 1 are made through the multiconductors 41 and 42.

Figure 3:
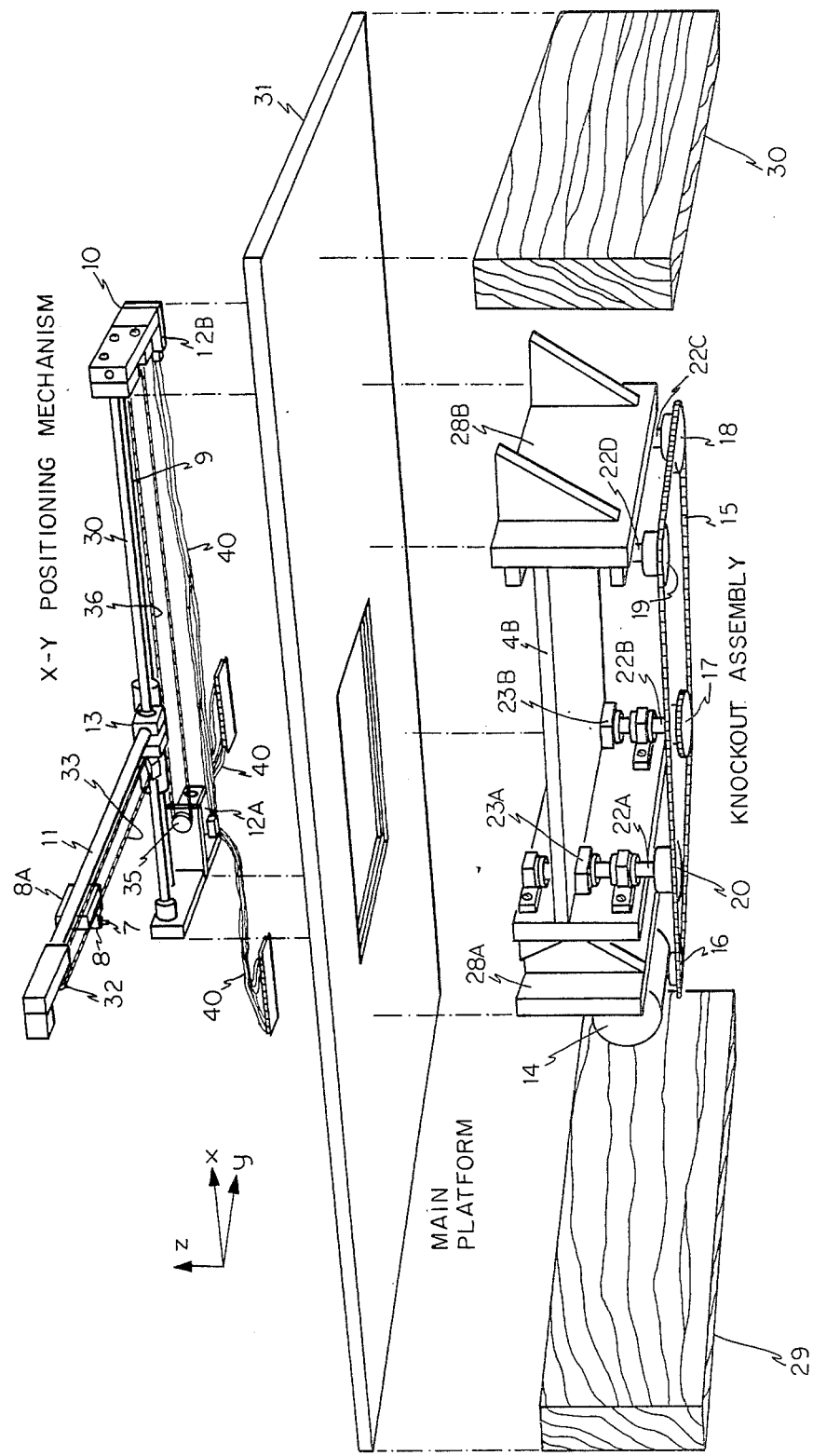
FIG. 3 is an isometric, exploded view showing some of the structural elements of the automatic switching matrix of FIG. 2.

The knock-out board 4A-4B is moved up and down in FIG. 2 (±z-direction) by an electric motor 14 in FIG. 3 that acts through a chain and sprocket system that consists of a closed-loop chain 15 and five sprockets 16, 17, 18, 19 and 20; the sprockets 17-20 turn threaded shafts 22A-22D in FIG. 3 to move the knock-out board 4A-4B in FIG. 2 and up and down for the purposes previously discussed. The elements 24-27 in FIG. 2 are ball bearings that are bolted to support members 28A and 28B, as shown, and hold the threaded shafts 22A-22D in position while letting them turn freely. The nuts 23A, 23B . . . are threaded on the shafts 22A, 22B . . . , respectively, to move in the ±Z direction in FIG. 2 as the shafts 22A, 22B . . . are turned. The nuts 23A, 23B . . . are fastened to the knock-out board 4A-4B of FIG. 2, which then also moves in the ±Z direction when the shafts are turned. Turning the shafts in one direction moves the knockout board in the +Z direction; turning the shafts in the other direction moves the knockout board in the −z direction.

Figure 6:
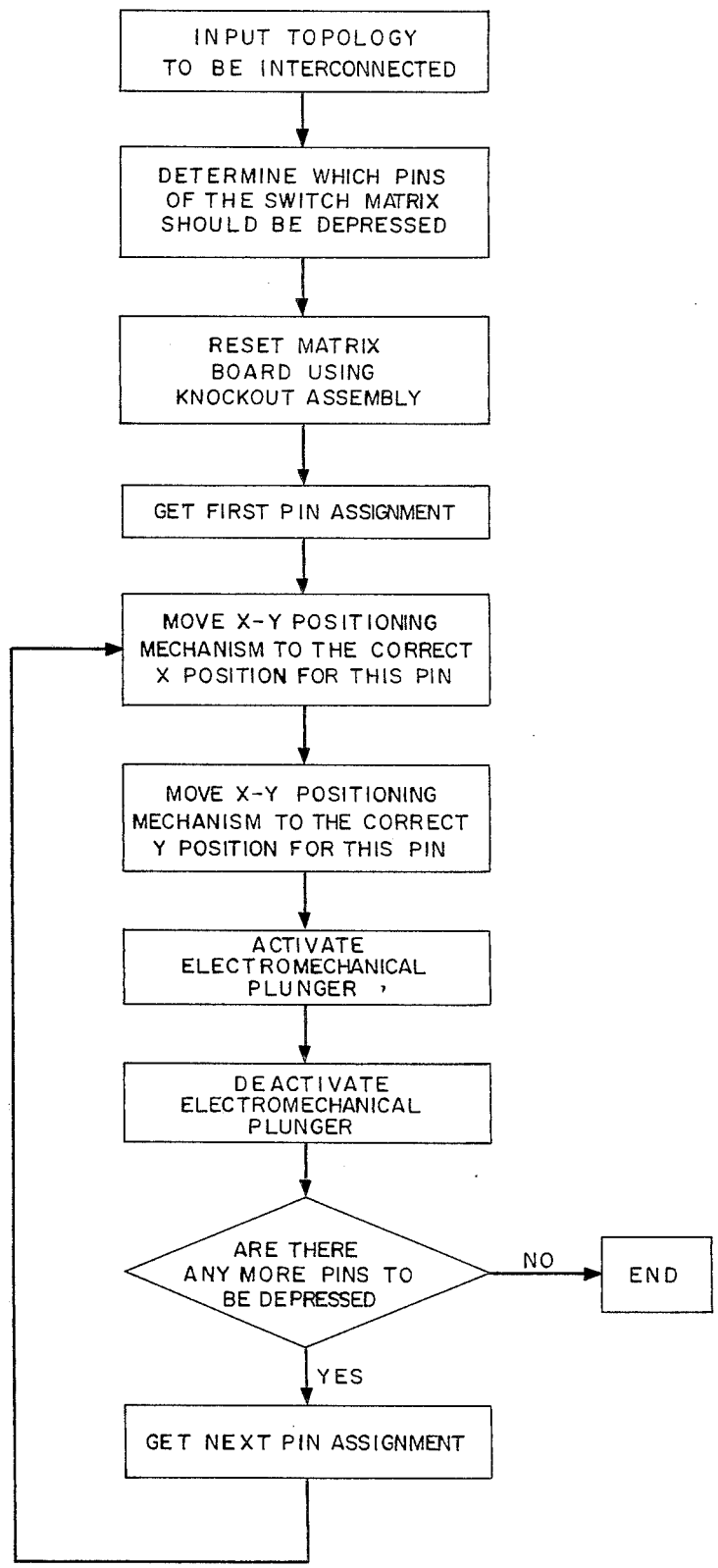
FIG. 6 is a flow chart for programming the computer of FIG. 1 to perform the automatic functions hereinafter outlined.

The foregoing functions are performed under the direction of the computer 37 in FIG. 1, the computer being programmed n accordance with the flow-chart in FIG. 6, which is self-explanatory.

A few comments of a general nature are contained in this paragraph. In the foregoing description, there is shown, in accordance with the Patent Act, the best mode contemplated by the present inventors to perform the inventive concepts herein disclosed. Modification of the disclosed apparatus could include a mechanism to deliver conductive pins 3 to respective apertures and insertion herein, and the conductive pins 3 could be selectively and individually removed from an aperture. The automatic switching interface 39 provides a switching interface between a computer and a group of circuit elements to permit interconnection of those circuit elements in very complex circuit configurations and reconnection to other very complex circuit configurations, quickly and easily under the control of the computer. The matrix 39 is versatile, easily shared and it has a very high density of switching stations, e.g., the matrix built and being used at the Massachusetts Institute of Technology has 2500 apertures (i.e., switching stations) in a six-inch by six-inch area.

Further modifications, of the invention herein disclosed will occur to persons skilled in the art and all such modifications are deemed to be within the spirit and scope of the invention as defined by the appended claims.

What is claimed is:

1. An automatic switching matrix that comprises, in combination
   (a) an apertured matrix board comprising a matrix of intersecting conductors that can be interconnected at any intersection thereof, the matrix board having apertures that extend from one major surface to the other major surface thereof, each aperture mating with an intersection of intersecting conductors;
   (b) a plurality of conductive connection pins, one such pin being disposed to register with each aperture and initially out of contact with the conductors located in the associated aperture;

(c) means for automatically depressing individual connection pins into selected apertures, which automatic depressing means comprises:
  (i) an x-y positioning mechanism and
  (ii) an electro-mechanical pin depressing mechanism which is positioned, automatically, by the x-y positioning mechanism; and (d) an automatic reset mechanism that forces the connection pins from apertures in which they are inserted, which the automatic reset mechanism comprises a knock-out board containing a plurality of reset pins, each such reset pin being located to register with an aperture in the matrix board, and means to move the knockout board toward the matrix board so that the reset pins will enter the matrix board and push the conductive connection pins out of the electrical connection with the conductors in the corresponding hole.

2. An automatic switching matrix as claimed in claim 1 wherein said automatic reset mechanism further comprises a threaded shaft at each corner of the knockout board, nuts connected to the knockout board at each corner to receive a corresponding threaded shaft, a timing chain interconnected with each shaft to rotate the shafts equally, and a drive motor connected to drive the timing chain a predetermined distance.

* * * * *